United States Patent
Otremba

(10) Patent No.: US 8,806,741 B2
(45) Date of Patent: Aug. 19, 2014

(54) METHOD OF MAKING AN ELECTRONIC DEVICE

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/267,330

(22) Filed: Oct. 6, 2011

(65) Prior Publication Data

US 2012/0027928 A1 Feb. 2, 2012

Related U.S. Application Data

(62) Division of application No. 11/862,553, filed on Sep. 27, 2007, now Pat. No. 8,077,475.

(51) Int. Cl.
*H05K 3/32* (2006.01)
*H01L 21/56* (2006.01)

(52) U.S. Cl.
USPC ............... 29/832; 29/841; 29/885; 438/122; 427/96.1; 427/96.2

(58) Field of Classification Search
USPC ............ 29/825, 874, 885, 832, 841; 257/675, 257/706; 438/122; 174/260; 427/122, 58, 427/126.3, 96.1, 96.2
See application file for complete search history.

(56) References Cited

U.S. PATENT DOCUMENTS

| | | | | |
|---|---|---|---|---|
| 5,120,678 A | * | 6/1992 | Moore et al. | 29/840 |
| 5,886,400 A | | 3/1999 | Letterman, Jr. et al. | |
| 5,935,399 A | * | 8/1999 | Tanaka et al. | 204/424 |
| 5,945,735 A | * | 8/1999 | Economikos et al. | 257/710 |
| 6,545,353 B2 | * | 4/2003 | Mashino | 257/724 |
| 7,074,340 B2 | * | 7/2006 | Lugstein et al. | 216/11 |
| 7,187,064 B2 | | 3/2007 | Tzu et al. | |
| 7,314,780 B2 | * | 1/2008 | Shimizu et al. | 438/108 |
| 7,317,610 B2 | * | 1/2008 | Nakamura et al. | 361/540 |
| 8,077,475 B2 | * | 12/2011 | Otremba | 361/770 |
| 8,291,584 B2 | * | 10/2012 | Tanaka | 29/841 |
| 2002/0109211 A1 | | 8/2002 | Shinohara | |
| 2003/0190425 A1 | * | 10/2003 | Lugstein et al. | 427/264 |
| 2005/0070128 A1 | * | 3/2005 | Xia et al. | 438/789 |
| 2005/0150683 A1 | | 7/2005 | Farnworth et al. | |
| 2005/0263911 A1 | | 12/2005 | Igarashi et al. | |

(Continued)

FOREIGN PATENT DOCUMENTS

JP 8116012 5/1996

OTHER PUBLICATIONS

Final Office Action mailed Apr. 15, 2011 in U.S. Appl. No. 11/862,553.
Office Action mailed Oct. 28, 2010 in U.S. Appl. No. 11/862,553.

*Primary Examiner* — Peter DungBa Vo
*Assistant Examiner* — Kaying Kue
(74) *Attorney, Agent, or Firm* — Dicke, Billig & Czaja, PLLC

(57) ABSTRACT

An electronic device is disclosed. One embodiment provides a metallic body. A first electrically insulating layer is applied over the metallic body and having a thickness of less than 100 μm. A first thermally conductive layer is applied over the first electrically insulating layer and having a thermal conductivity of more than 50 W/(m·K). A second electrically insulating layer is applied over the first thermally conductive layer and having a thickness of less than 100 μm.

5 Claims, 5 Drawing Sheets

(56) References Cited

U.S. PATENT DOCUMENTS

| | | |
|---|---|---|
| 2008/0122066 A1* | 5/2008 | Ishii ............................. 257/703 |
| 2008/0132087 A1* | 6/2008 | Xia et al. ...................... 438/789 |
| 2008/0271875 A1* | 11/2008 | Lima ............................ 165/80.3 |
| 2008/0277777 A1* | 11/2008 | Liao et al. .................... 257/712 |
| 2009/0008765 A1* | 1/2009 | Yamano et al. ............... 257/690 |

* cited by examiner

METHOD OF MAKING AN ELECTRONIC DEVICE

CROSS-REFERENCE TO RELATED APPLICATIONS

This Utility Patent Application is a divisional application of U.S. application Ser. No. 11/862,553, filed Sep. 27, 2007, which is incorporated herein by reference.

BACKGROUND

This invention relates to an electronic device and a method of assembling thereof.

Electronic devices may include two or more components which are electrically coupled to one another or electrically insulated from one another. The electronic devices may, therefore, contain both electrically conductive means and electrically insulating means so as to provide the desired arrangement with the device.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
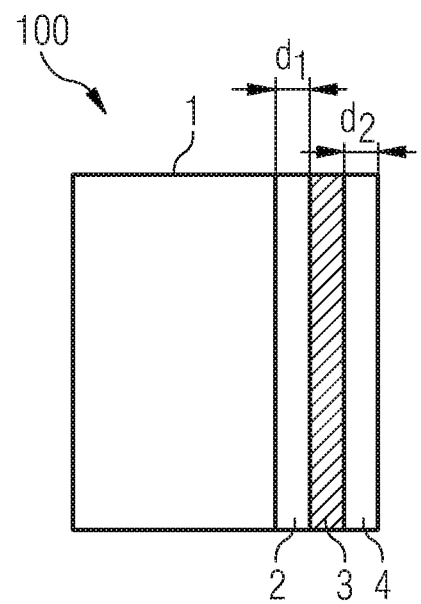
FIG. 1 schematically illustrates an electronic device 100 according to an exemplary embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Electronic devices with a metallic body are described below. The metallic body may be of any shape, size or metallic material. During the fabrication of the device the metallic body may be provided in a way that other metallic bodies are arranged in the vicinity and are connected by connection means to the metallic bodies with the purpose of separating the metallic bodies. The metallic body may, in one embodiment, be fabricated from copper, nickel or aluminum or any metal alloy. The metallic body may be, for example, a coil, a cable, a conductor, a capacitor, a passive electric component, a housing, a case housing a device, for example a high-voltage device, a leadframe or a part of a leadframe, such as a die pad.

The devices may further include one or more semiconductor chips. The semiconductor chips may, for example, be placed on the metallic bodies or may placed within the metallic bodies. The semiconductor chips may be of extremely different types and may include for example integrated electrical or electro-optical circuits. The semiconductor chips may be, for example, configured as power transistors, power diodes, IGBTs (Insulated Gate Bipolar Transistors), control circuits, driver circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact pads on its two main surfaces, that is to say on its top side and bottom side. In one embodiment, power transistors and power diodes may have a vertical structure. By way of example, the source electrode and gate electrode of a power transistor and the anode electrode of a power diode may be situated on one main surface, while the drain electrode of the power transistor and the cathode electrode of the power diode are arranged on the other main surface. A power diode may be embodied as a Schottky diode. Furthermore, the devices described below may include integrated circuits to control and/or drive the integrated circuits of other semiconductor chips, for example, the integrated circuits of power transistors or power diodes. The semiconductor chips need not be manufactured from specific semiconductor material and, furthermore, may contain inorganic and/or organic materials that are not semiconductors, such as for example insulators, plastics or metals. Moreover, the semiconductor chips may be packaged or unpackaged.

The semiconductor chips have contact pads which allow electrical contact to be made with the semiconductor chips. The contact pads may be composed of any desired electrically conductive material, for example of a metal, such as copper, aluminum or gold, a metal alloy or an electrically conductive organic material. The contact pads may be situated on the active surfaces of the semiconductor chips or on other surfaces of the semiconductor chips. In case of a power transistor, the contact pads include drain, source and gate electrodes.

The devices include a plurality of electrically insulating layers. The electrically insulating layers may cover any fraction of any number of surfaces of the components of the device. The electrically insulating layers may serve various functions. They may be used, for example, to electrically insulate components of the devices from each other and/or from external components, but they may also be used as platforms to mount other components. The electrically insulating layers may be fabricated using various techniques. For example, the electrically insulating layers may be deposited from a gas phase or may be laminated as foils. The electrically insulating layers may, for example, be made from organic materials, such as imide, epoxy or duroplast, metal oxide, semiconductor oxide, ceramics or diamond-like carbon.

One or more thermally conductive layers may be applied on the electrically insulating layers. The thermal conductivity of these layers may be higher than 50 W/(m·K) (units in Watt/(meter·Kelvin)). For example, copper has a thermal conductivity of about 401 W/(m·K) and aluminum of about 237 W/(m·K). In one embodiment, the thermally conductive layers may be electrically conductive. In this case, a predetermined electrical potential may be applied to the electrically conductive layers, but the electrical potential of the electrically conductive layers may also be floating. The thermally conductive layers may be manufactured with any desired geometric shape and any desired material composition. Any desired thermally conductive materials, such as metals, for example copper, nickel or aluminum, metal alloys or organic conductors, may be used as the material. The thermally conductive layers need not be homogenous or manufactured from just one material, that is to say various compositions and concentrations of the materials contained in the thermally conductive layers are possible. Furthermore, the thermally conductive layers may be arranged above or below or between electrically insulating layers.

The devices may include a mold material covering at least parts of the components of the devices. The mold material may be any appropriate thermoplastic or thermosetting material. Various techniques may be employed to cover the components with the mold material, for example compression molding or injection molding.

FIG. 1 schematically illustrates an electronic device 100 in a cross section as an exemplary embodiment. The device 100 includes a metallic body 1. A first electrically insulating layer 2 is applied over the metallic body 1. The first electrically insulating layer 2 has a thickness $d_1$ of less than 100 µm. In one embodiment, the thickness $d_1$ may be less than 50 µm or may be in the range between 1 and 10 µm. A first thermally conductive layer 3 is applied over the first electrically insulating layer 2. The thermally conductive layer 3 has a thermal conductivity of more than 50 W/(m·K) and more than 100 or 200 W/(m·K). A second electrically insulating layer 4 is applied over the first thermally conductive layer 3. The second electrically insulating layer 4 has a thickness $d_2$ of less than 100 µm. In one embodiment, the thickness $d_2$ may be less than 50 µm or may be in the range between 1 and 10 µm.

The device 100 may include further electrically insulating layers and further thermally conductive layers which are applied over the second electrically insulating layer 4. The electrically insulating layers may, for example, be deposited from a gas phase or may be laminated as foils on top of the underlying structures. The electrically insulating layers may be fabricated from materials such as organic materials, for example imide, epoxy or duroplast, or metal oxides or semiconductor oxides or ceramics or diamond-like carbon. The thermally conductive layers may be fabricated from metals or metal alloys. The metallic body 1 may be, for example, a coil, a cable, a conductor, a capacitor, a passive electric component, a housing, a case housing a device, for example a high-voltage device, a leadframe or a part of a leadframe, such as a die pad, or any other carrier provided to carry an electronic component, such as a semiconductor chip.

In the embodiment illustrated in FIG. 1, the electrically insulating and thermally conductive layers cover an entire surface of the metallic body 1. It may, for example, also be provided that the electrically insulating and thermally conductive layers cover only a fraction of a surface or several surfaces of the metallic body 1.

Figure 2:
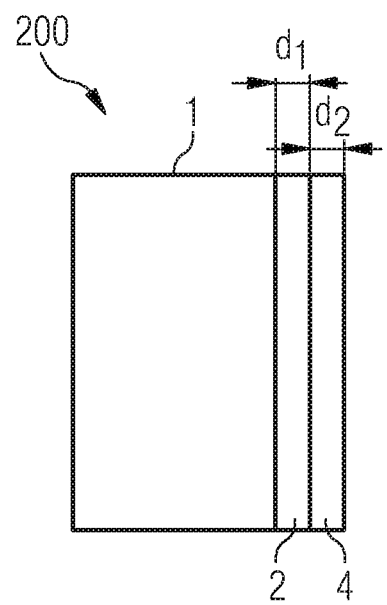
FIG. 2 schematically illustrates an electronic device 200 according to an exemplary embodiment.

FIG. 2 schematically illustrates an electronic device 200 in a cross section as a further exemplary embodiment. The device 200 includes the metallic body 1 and the first electrically insulating layer 2 and the second electrically insulating layer 4 applied over the metallic body 1. The metallic body 1 and the electrically insulating layers 2 and 4 may be embodied as in the device 100 illustrated in FIG. 1. The electrically insulating layers 2 and 4 have a thickness $d_1$ and $d_2$ of less than 100 µm or less than 50 µm or in the range between 1 and 10 µm, respectively. The first electrically insulating layer 2 is made of a first material from a first group of materials, and the second electrically insulating layer 4 is made of a second material from a second group of materials. One of the first group and the second group of materials may contain organic electrically insulating materials, such as imide, epoxy and duroplast. The other group of materials may contain metal oxides, semiconductor oxides, ceramic materials and carbon-like diamond.

The device 200 may include further electrically insulating layers deposited on the metallic body 1. The electrically insulating layers may be alternately made of materials from the first group of materials and the second group of materials. For example, if a third electrically insulating layer is applied over the second electrically insulating layer, the third electrically insulating layer may be made of a material from the first group of materials. If a fourth electrically insulating layer is applied over the third electrically insulating layer, the fourth electrically insulating layer may be made of a material from the second group of materials.

Figure 3A:
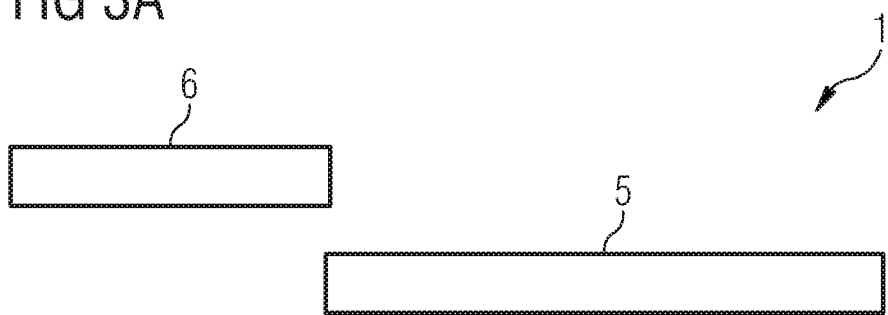
FIGS. 3A to 3H schematically illustrate an exemplary embodiment of a method to fabricate an electronic device 300.
Figure 3B:
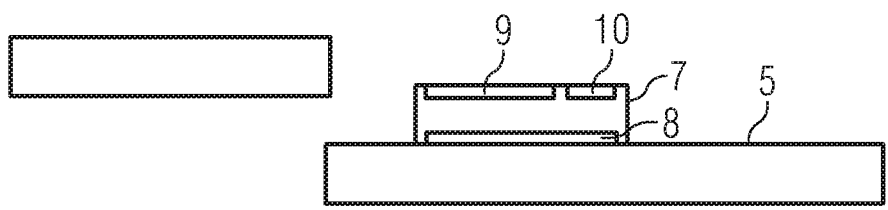
Figure 3C:
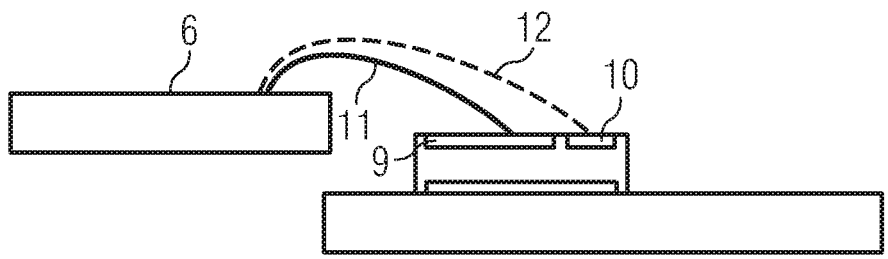
Figure 3D:
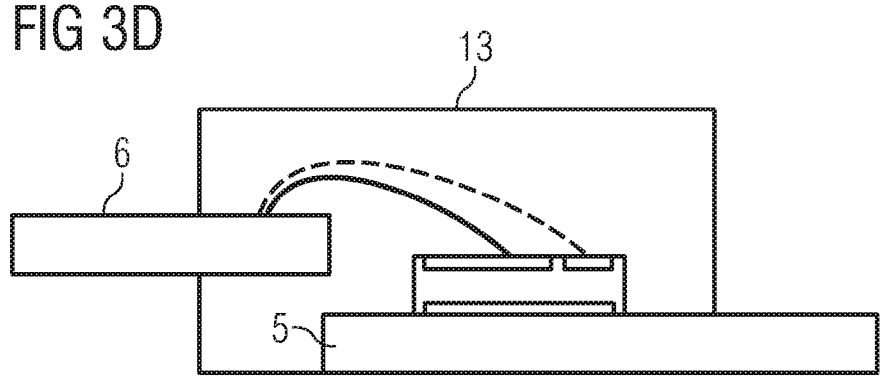
Figure 3E:
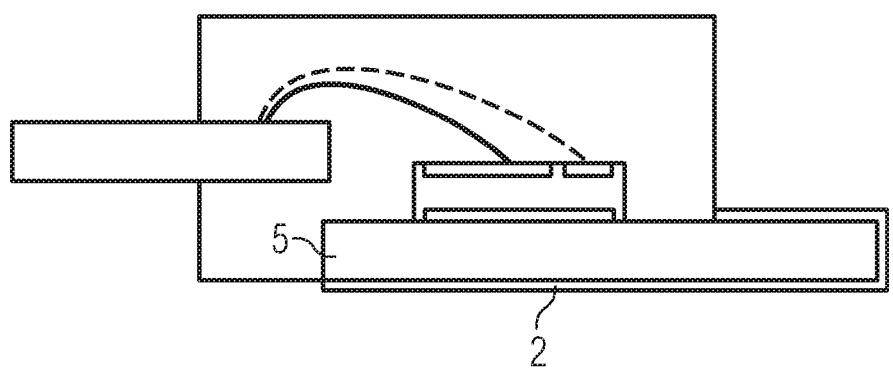
Figure 3F:
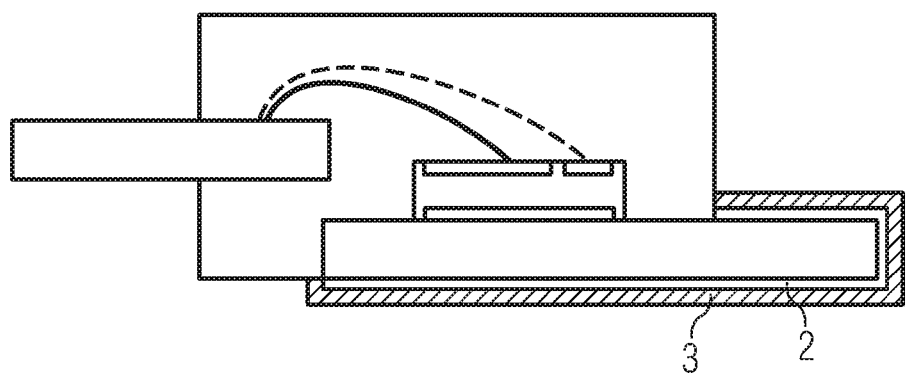
Figure 3G:
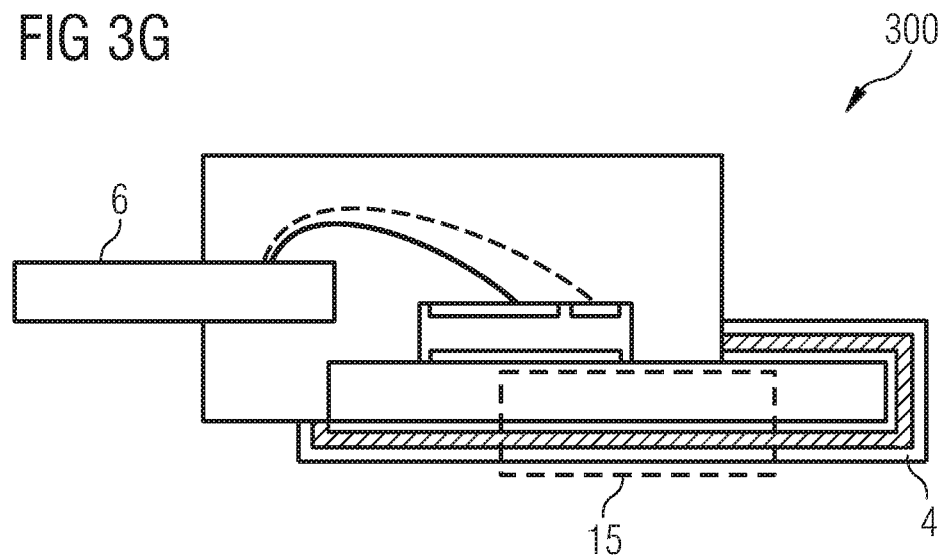

In FIGS. 3A to 3H different stages of the fabrication of an electronic device 300, which is illustrated in FIG. 3G, are exemplarily illustrated. The device 300 is an implementation of the devices 100 and 200 illustrated in FIGS. 1 and 2. The details of the fabrication method as well as the features of the device 300 that are described below can therefore be likewise applied to the devices 100 and 200.

Firstly the metallic body 1 is provided, which is a leadframe in the present embodiment. The leadframe 1 is illustrated in cross section in FIG. 3A and may, for example, be a part of a leadframe strip. The leadframe strip is manufactured from a metal, such as copper or nickel. At each device position of the leadframe strip, a die pad 5 and a plurality of leads, of which only the lead 6 is illustrated in FIG. 3A, are provided. The lead 6 is spaced at a distance from the die pad 5.

A semiconductor chip 7 is mounted on the upper surface of the die pad 5 (see FIG. 3B). In the present embodiment, the semiconductor chip 7 is a vertical power transistor, for example a MOSFET, and includes a drain electrode 8 on its lower surface and a source electrode 9 and a gate electrode 10 on its upper surface. The drain electrode 8 may be electrically connected to the upper surface of the die pad 5.

The electrical connection between the drain electrode 8 of the power transistor 7 and the die pad 5 may, for example, be produced by reflow soldering, vacuum soldering, diffusion soldering or adhesive bonding by using an electrically conductive adhesive.

If diffusion soldering is used as a connecting technique, it is possible to use solder materials which lead to intermetallic phases after the end of the soldering operation at the interface between the die pad 5 and the power transistor 7 on account of interface diffusion processes. In this case, the use of AuSn, AgSn, CuSn, AgIn, AuIn or CuIn solders is conceivable, for example, for a copper or nickel leadframe 5. If the power transistor 7 is adhesively bonded to the die pad 5, it is possible to use conductive adhesives which may be based on epoxy resins and be enriched with gold, silver, nickel or copper in order to produce the electrical conductivity.

As can be seen in FIG. 3C, electrical connections between the source electrode 9 and the lead 6 as well as the gate electrode 10 and a lead that is not illustrated in FIG. 3C are produced by bond wires 11 and 12, respectively. Since the lead to which the source electrode 10 is electrically connected is not illustrated in FIG. 3C, the bond wire 12 is indicated by a dashed line. Furthermore, the die pad 5 may also be electrically connected to one of the leads (not illustrated in FIG. 3C) in order to establish an external connection to the drain electrode 8 of the power transistor 7.

Other techniques to produce electrical connections with the leads may be alternatively utilized, for example clips or electrically conductive layers. Furthermore it may be provided that further semiconductor chips or other semiconductor chips than power transistors are mounted on the die pad or on top of the semiconductor chip 7 and are electrically connected to the leads.

After the electrical connections have been made, a mold transfer process may be carried out to encapsulate the components arranged on the leadframe 1 with a mold material 13 (see FIG. 3D). The mold material 13 may encapsulate any portion of the device 300, but leaves parts of die pad 5 and the lead 6 (as well as parts of the other leads) uncovered. The mold material 13 may also be filled in the spaces between the die pad 5 and the leads. In the present embodiment, the lower surface, parts of the side surfaces and a part of the upper surface of the die pad 5 are not covered with the mold material 13.

The mold material 13 may be composed of any appropriate thermoplastic or thermosetting material, in one embodiment it may be composed of a material commonly used in contemporary semiconductor packaging technology. Various techniques may be employed to cover the components of the device 300 with the mold material 13, for example compression molding or injection molding.

Before or after the encapsulation process, the exposed surfaces of the die pad 5 are coated with the first electrically insulating layer 2. The electrically insulating layer 2 may be fabricated from materials such as organic materials, such as imide, epoxy or duroplast, or metal oxides, such as titanium oxide, chromium oxide or zinc oxide, or semiconductor oxides, such as silicon dioxide, or ceramics, such as aluminum oxide ($Al_2O_3$), or amorphous carbon materials, such as diamond-like carbon.

Various techniques may be employed to deposit the first electrically insulating layer 2. The electrically insulating layer 2 may be deposited from a gas phase or a solution and may be built-up in a layer-by-layer fashion to a desired thickness. Techniques that can be employed for this kind of deposition are, for example, physical or chemical vapor deposition, spin-on processes, spray depositing or ink jet printing.

In one embodiment, if the electrically insulating material is made of an organic material, the electrically insulating layer 2 may be embodied as a foil. The foil may be laminated onto the exposed surfaces of the die pad 5 by applying a vacuum as well as heat and pressure for a time suitable to adhere the electrically insulating layer 2 to the die pad 5.

The thickness of the electrically insulating layer 2 may be in the range from 0.1 to 100 µm and in the range from 1 to 10 µm.

The electrically insulating layer 2 may be coated with the first thermally conductive layer 3 as can be seen in FIG. 3F. The thermally conductive layer 3 may be electrically insulating, but may also be electrically conductive. In the latter case, copper, iron, nickel or other metals or metal alloys may be used as material. The thermally conductive layer 3 may be produced by electroless and/or galvanic plating processes. Thereby a seed layer may be first electroless deposited onto the exposed surfaces of the electrically insulating layer 2. Materials such as palladium or titanium may be used for the seed layer which usually has a thickness of less than 1 µm.

The thickness of the seed layer may be increased by depositing a further layer of an electrically conductive material onto the seed layer. For example, a layer of copper may be electroless deposited onto the seed layer. This copper layer may have a thickness of less than 1 µm. Afterwards another layer of copper may be galvanically deposited, which may have a thickness of more than 5 µm. The electroless copper deposition may also be omitted.

In one embodiment, the seed layer may be deposited by a vacuum deposition process, such as sputtering. For example, first a layer of titanium having a thickness of, for example, about 50 nm and afterwards a layer of copper having a thickness of, for example, about 200 nm are sputtered. The copper layer may then be used as a seed layer to galvanically deposit a further copper layer having a thickness of more than 5 µm.

In one or more embodiments, other deposition methods, such as physical vapor deposition, chemical vapor deposition, spin-on processes, spray depositing or ink jet printing may also be used. The thickness of the thermally conductive layer 3 may be in the range from 0.1 µm to 1 mm and in the range from 1 µm to 100 µm.

After the deposition of the thermally conductive layer 3, the second electrically insulating layer 4 is deposited onto the thermally conductive layer 3 as illustrated in FIG. 3G. The properties and manufacturing method of the second electrically insulating layer 4 may be similar to the properties and manufacturing method of the first electrically insulating layer 2 described above.

As described further below, it may be provided that further electrically insulating layers and/or thermally conductive layers are deposited on the stacked layers 2, 3 and 4. Furthermore, it may be provided that the stacked layers 2, 3 and 4 are generated before the components of the device 300 are encapsulated with the mold material 13. In this case, at least some sections of the layers 2, 3 and 4 may be covered with the mold material 13.

After the manufacturing process, the exposed surfaces of the lead 6 and the other leads, which are not illustrated in FIG. 3G, provide the external contact elements of the drain electrode 8, the source electrode 9 and the gate electrode 10 of the power transistor 7. The exposed surfaces of the leads may be cleaned and tin-plated. The individual devices 300 may be then singulated from the leadframe strip.

Figure 3H:
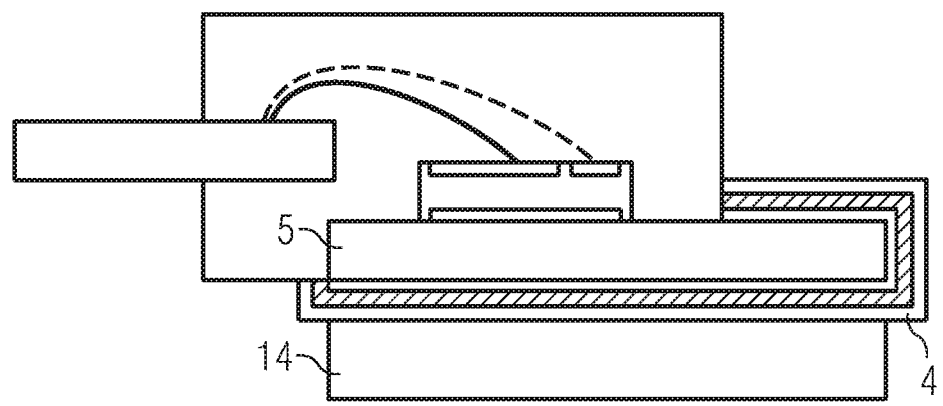

On the stacked layers 2, 3 and 4 a heat sink or cooling element 14 may be attached (see FIG. 3H). The heat sink or cooling element 14 is electrically insulated from the die pad 5 by the electrically insulating layers 2 and 4.

Figure 4:
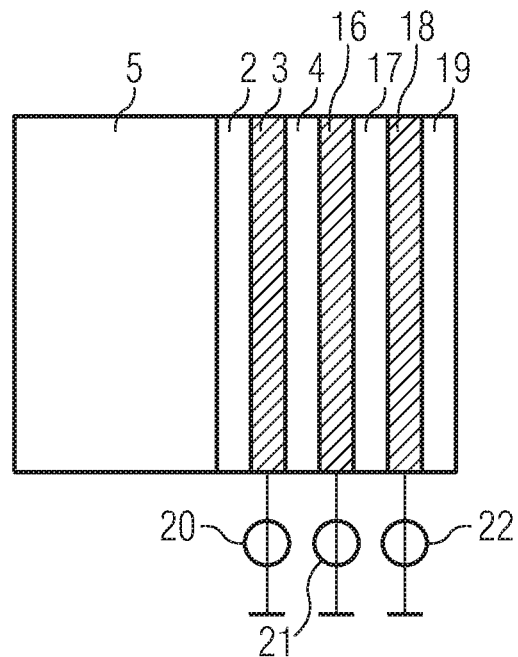
FIG. 4 schematically illustrates a further embodiment of the device 300.
Figure 5:
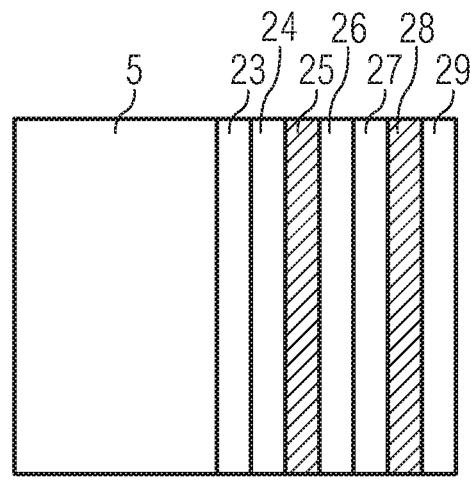
FIG. 5 schematically illustrates yet a further embodiment of the device 300.

In FIGS. 4 and 5, further embodiments of the electrically insulating layers and the thermally conductive layers deposited on the die pad 5 (or the metallic body 1) are illustrated. A section 15 of the die pad 5 and the layers deposited on the die pad 5 are illustrated in FIGS. 4 and 5. The section 15 is indicated in FIG. 3G by dashed lines.

In FIG. 4 a second thermally conductive layer 16, a third electrically insulating layer 17, a third thermally conductive layer 18 and a fourth electrically insulating layer 19 are stacked on the second electrically insulating layer 4 in the stated order. The thermally conductive layers 16 and 18 may have properties as described above and may be electrically conductive. The electrically insulating layers 17 and 19 may have the same or similar properties as the electrically insulating layers 2 and 4, and may have a thickness of less than 100 μm.

The electrically insulating layers 2, 4, 17 and 19 provide an electrical strength ensuring that the outer surface of the device 300 and, in one embodiment, the heat sink 14 are electrically insulated from the voltage applied to the die pad 5. In case of the semiconductor chip 7 being a power transistor, the voltage applied to the die pad 5 via the drain electrode 8 of the power transistor 7 may be as high as several hundred volts. Since each of the electrically insulating layers 2, 4, 17 and 19 has a thickness of less than 100 μm, several of these layers are needed to electrically insulate the outer surface of the device 300 from the high voltage applied to the die pad 5. If the applied voltage is lower, fewer electrically insulating layers are needed. The number of the electrically insulating layers is not restricted to 2, 3, 4 or 5, in fact the number of the electrically insulating layers coating the die pad 5 in a layer-by-layer fashion is unlimited and can be chosen according to the desired application.

The thermally conductive layers 3, 16 and 18 may help to thermally couple the die pad 5 to the heat sink 14. The thermally conductive layers 3, 16 and 18 allow to transfer the heat generated by the semiconductor chip 7 to the heat sink 14, which dissipates the generated heat. The number of the thermally conductive layers is not restricted to 1, 2 or 3, in fact the number of the thermally conductive layers is unlimited and can be chosen according to the desired application. Furthermore, the thermally conductive layers may be used as seed layers for the deposition of the electrically insulating layers thereon. In one embodiment, this may apply to gas phase deposited electrically insulating layers.

It may be provided that predetermined and fixed electrical potentials are applied to the electrically conductive layers 3, 16 and 18. As illustrated in FIG. 4, output terminals of voltage sources 20, 21 and 22 producing predetermined and fixed potentials versus a ground potential are connected to the electrically conductive layers 3, 16 and 18, respectively. According to an embodiment, the same electrical potential is applied to the electrically conductive layers 3, 16 and 18, for example the ground potential.

The electrically conductive layers 3, 16 and 18 may reduce the capacitive coupling between the die pad 5 and any component placed outside of the device 300, for example the heat sink 14. The electrically conductive layers 3, 16 and 18 may at least partly shield electromagnetic radiation emitted from the semiconductor chip 7.

According to a further embodiment, the electrically conductive layers 3, 16 and 18 are not coupled to voltage sources, but are electrically insulated from any fixed electrical potential resulting in floating potentials of the electrically conductive layers 3, 16 and 18. In this case the electrically conductive layers 3, 16 and 18 may act as voltage dividers. For example, a high voltage applied to the die pad 5 may be gradually reduced by the electrically conductive layers 3, 16 and 18.

The materials that are used to fabricate the electrically insulating layers 2, 4, 17 and 19 may be divided into two groups. The materials of a first group, for example organic materials, such as imide, epoxy or duroplast, may exhibit a high thermal cycle stability, but may be relatively soft and may thus be easily damaged by mechanical force. The materials of the second group, for example metal oxides, semiconductor oxides, ceramics and diamond-like carbon, may be rugged and may show a high mechanical strength. When stacking the electrically insulating materials of the two groups alternately, the properties of both groups can be combined. The materials of the first group provide for a good thermal cycle stability and the materials of the second group provide for a high mechanical strength. For example, the electrically insulating layers 2 and 17 may be manufactured from materials of the first group and the electrically insulating layers 4 and 19 may be manufactured from materials of the second group or vice versa.

It is obvious to a person skilled in the art that the embodiments of the device 300 illustrated in FIGS. 3G and 4 are only intended to be exemplary embodiments, and many variations are possible. For example, at least some of the thermally conductive layers may be omitted between the electrically insulating layers. Furthermore, if two groups of materials are used for the electrically insulating layers as described above, it may be provided that not necessarily an electrically insulating layer of the first group succeeds an electrically insulating layer of the second group in the sequence of the electrically insulating layers and vice versa. Such an embodiment is illustrated in FIG. 5. There, electrically insulating layers 23 and 24, an electrically conductive layer 25, electrically insulating layers 26 and 27, an electrically conductive layer 28 and an electrically insulating layer 29 are stacked on the die pad 5 in the stated order. For the electrically insulating layers 23 and 27 materials from the first group may be used and for the electrically insulating layers 24, 26 and 29 materials from the second group may be used or vice versa.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A method, comprising:
providing a metallic body comprising a die pad and a plurality of leads;
mounting a semiconductor chip on the die pad, the semiconductor chip including an electrode electrically coupled to the die pad;

encapsulating the semiconductor chip, portions of the die pad outside of a region covered by the semiconductor chip, and portions of the plurality of leads in a mold material;

depositing a first electrically insulating layer directly on surfaces of the die pad not covered by the mold material from a gas phase;

depositing a first thermally conductive layer directly on the first electrically insulating layer, and depositing a second electrically insulating layer directly on the first thermally conductive layer from a gas phase.

2. The method of claim 1, comprising wherein the first thermally conductive layer is electrically conductive.

3. The method of claim 1, comprising depositing a second thermally conductive layer on the second electrically insulating layer, the second thermally conductive layer having a thermal conductivity of more than 50 W/(m·K).

4. The method of claim 1, comprising depositing a third electrically insulating layer on the second electrically insulating layer from a gas phase.

5. The method of claim 1, wherein the first thermally conductive layer has a thermal conductivity of more than 50 W/(m·K).

\* \* \* \* \*